United States Patent
Yokokawa et al.

(10) Patent No.: US 8,799,739 B2
(45) Date of Patent: *Aug. 5, 2014

(54) RECEIVING APPARATUS, RECEIVING METHOD, PROGRAM, AND RECEIVING SYSTEM

(75) Inventors: Takashi Yokokawa, Kanagawa (JP); Osamu Shinya, Kanagawa (JP)

(73) Assignee: Sony Corporation, Tokyo (JP)

( * ) Notice: Subject to any disclaimer, the term of this patent is extended or adjusted under 35 U.S.C. 154(b) by 427 days.

This patent is subject to a terminal disclaimer.

(21) Appl. No.: 12/725,725

(22) Filed: Mar. 17, 2010

(65) Prior Publication Data

US 2010/0251078 A1    Sep. 30, 2010

(30) Foreign Application Priority Data

Mar. 24, 2009  (JP) .............................. P2009-072161

(51) Int. Cl.
   *H03M 13/00*   (2006.01)
(52) U.S. Cl.
   USPC .......................................... 714/758; 714/776
(58) Field of Classification Search
   USPC .......... 714/776, 752, 755, 758, 780, 784, 786
   See application file for complete search history.

(56) References Cited

U.S. PATENT DOCUMENTS

| | | | |
|---|---|---|---|
| 6,684,365 B1 * | 1/2004 | Murayama et al. ........... | 714/787 |
| 7,644,339 B2 * | 1/2010 | Tran et al. .................... | 714/758 |
| 7,783,958 B1 * | 8/2010 | Eidson et al. ................. | 714/780 |
| 2008/0019263 A1 | 1/2008 | Stolpman | |

FOREIGN PATENT DOCUMENTS

| | | |
|---|---|---|
| JP | 63-234461 | 9/1988 |
| JP | 7-93913 | 4/1995 |
| JP | 2001-274693 | 10/2001 |
| JP | 2005-311565 | 11/2005 |
| JP | 2007-266710 | 10/2007 |
| JP | 2009-10767 | 1/2009 |

OTHER PUBLICATIONS

Bernhard M.J. Leiner, LDPC Codes—a brief Tutorial, Apr. 2005.*
Amin Shokrollah, LDPC Codes: An Introduction, Apr. 2003.*
DVB Organization: "T2_0447_DVB-T2_Implementation_Guidelines_0_7_2.doc", DVB, Digital Video Broadcasting, C/O EBU—17A Ancienne Route—CH-1218 Grand Saconnex, Geneva—Switzerland, Sep. 4, 2008, pp. 1-167, XP017817733.

(Continued)

*Primary Examiner* — M. Mujtaba K Chaudry
(74) *Attorney, Agent, or Firm* — Oblon, Spivak, McClelland, Maier & Neustadt, L.L.P.

(57) ABSTRACT

A receiving apparatus includes: an LDPC decoding device configured such that when an LDPC-coded data signal, LDPC representing Low Density Parity Check, and an LDPC-coded transmission control signal are transmitted in multiplexed fashion, the LDPC decoding device can decode both the data signal and the transmission control signal; a holding device configured to be located upstream of the LDPC decoding device and to hold at least the transmission control signal upon receipt of the data signal and the transmission control signal; and a control device configured to control the LDPC decoding device to decode the data signal while the transmission control signal is being accumulated in the holding device and to interrupt the current decoding so as to control the LDPC decoding device to decode the transmission control signal when the transmission control signal has been accumulated in the holding device.

7 Claims, 9 Drawing Sheets

(56) References Cited

OTHER PUBLICATIONS

ETSI: "Frame structure channel coding and modulation for a second generation digitalterrestrial television broadcasting system (DVB-T2)", Digital Video Broadcasting Document A122R1, no. DVB Document A122r1 Jan. 1, 2008, pp. 1-165, XP002523675, Retrieved from the Internet: URL:http://www.dvb.org/technology/standards/a122r1.tm3980r7.DVB-T2.pdf [retrieved on Apr. 15, 2009].

R. G. Gallager, "Low Density Parity Check Codes", Cambridge, Massachusetts: M. I. T. Press, 1963.

D. J. C. MacKay, "Good error correcting codes based on very parse matrices", Submitted to IEEE Trans. Inf. Theory, IT-45, pp. 399-431, 1999.

DVB BlueBook A122 Rev. 1, Frame structure channel coding and modulation for a second generation digital terrestrial television broadcasting system (DVB-T2), Dec. 2009.

DVB, Frame structure channel coding and modulation for a second generation digital terrestrial television broadcasting system (DVB-T2)', Digital Video Broadcasting Document A122, Jun. 2008, 30 pages.

\* cited by examiner

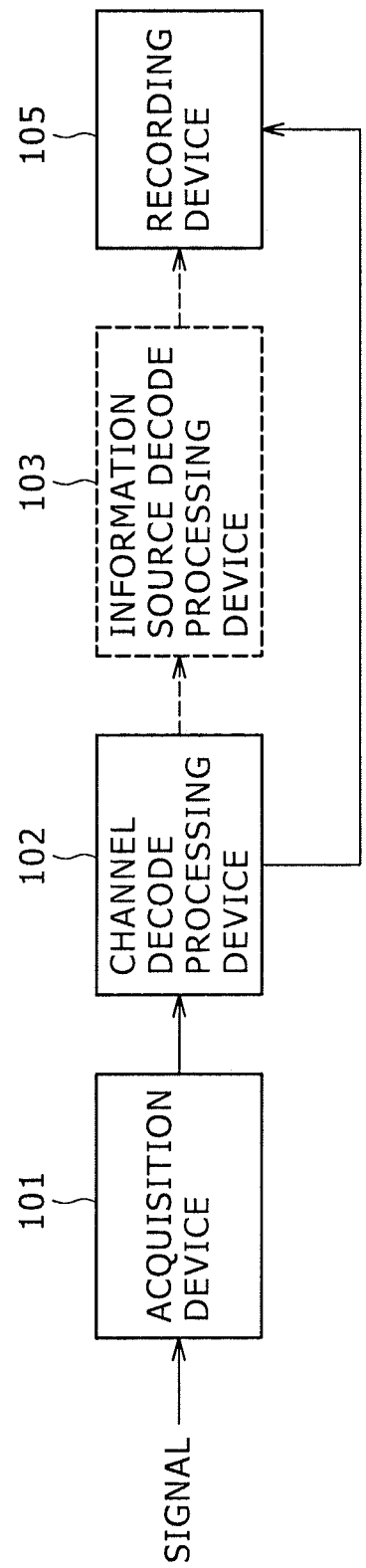

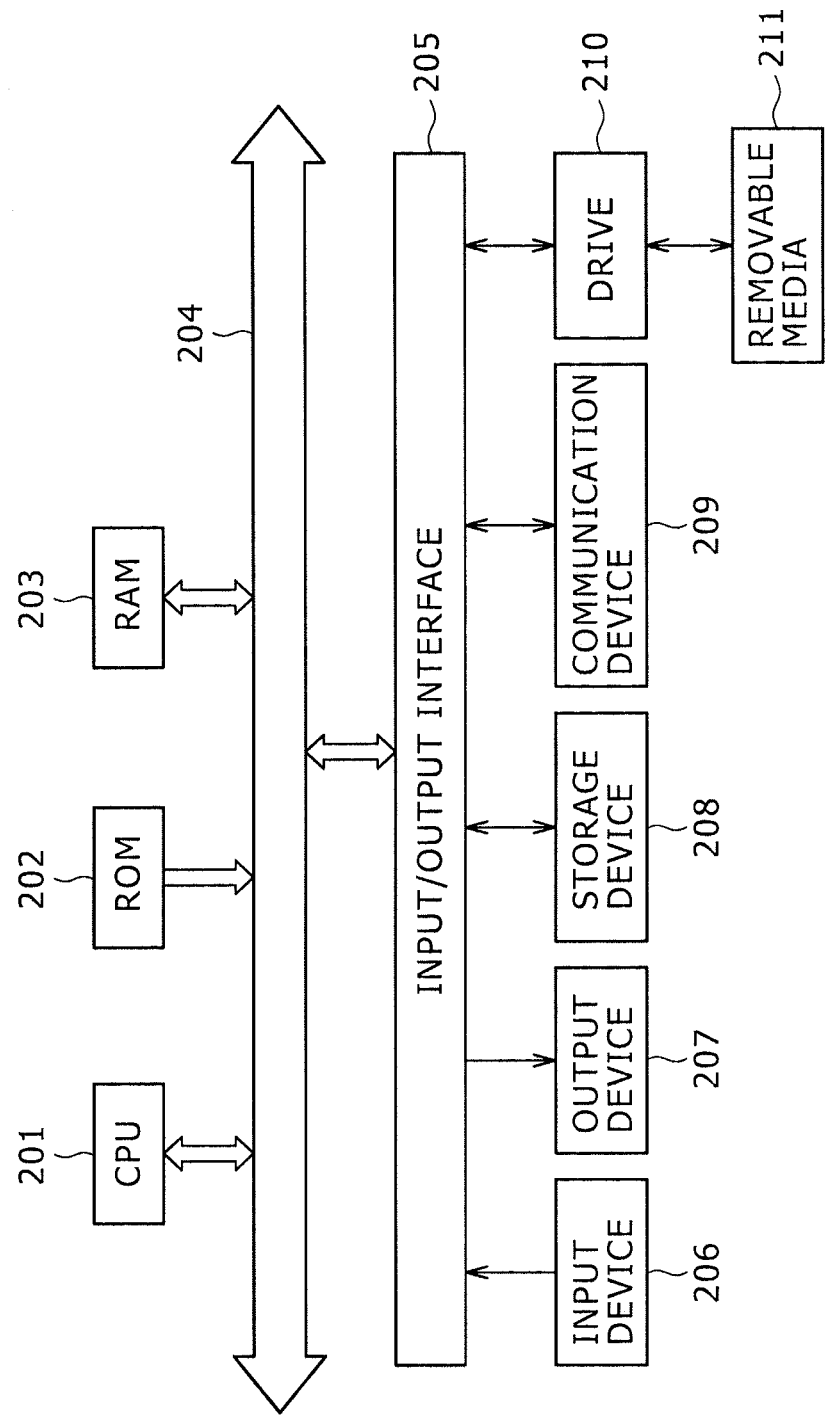

RECEIVING APPARATUS, RECEIVING METHOD, PROGRAM, AND RECEIVING SYSTEM

BACKGROUND OF THE INVENTION

1. Field of the Invention

The present invention relates to a receiving apparatus, a receiving method, a program, and a receiving system. More particularly, the invention relates to a receiving apparatus, a receiving method, a program, and a receiving system for allowing a DVB-T.2-compatible receiver to carry out LDPC decoding of PLPs and L1 using a single decoder.

2. Description of the Related Art

Communication systems perform reliable communications over noise-plagued communication channels by resorting to coding. For example, wireless systems such as satellite-based networks are exposed to numerous noise sources due to geographical and environmental factors. Such communication channels represent fixed capacities which are defined in terms of the number of bits per symbol at a given signal-to-noise ratio (SNR) and which constitute a theoretical upper limit known as the Shannon limit. As a result, coding design aims at attaining rates that approach the Shannon limit. This aim is closely related to limited bandwidth satellite-based systems.

Recent years have witnessed the development of coding techniques known as turbo coding which help to achieve performance levels getting close to the Shannon limit. Specifically, the developed techniques include Parallel Concatenated Convolutional Codes (PCCC) and Serially Concatenated Convolutional Codes (SCCC). Apart from these turbo coding techniques, Low Density Parity Check Codes (called LDPC coding hereunder), a traditional coding technique known from long ago, are again attracting attention today.

LDPC coding was first proposed by R. G. Gallager in "Low Density Parity Check Codes," Cambridge, Massachusetts: M. I. T. Press, 1963. Later, the technique once again drew attention when discussed illustratively by D. J. C. MacKay in "Good error correcting codes based on very parse matrices," submitted to IEEE Trans. Inf. Theory, IT-45, pp. 399-431, 1999, and by M. G. Luby, M. Mitzenmacher, M. A. Shokrollahi and D. A. Spielman, in "Analysis of low density codes and improved designs using irregular graphs," in Proceedings of ACM Symposium on Theory of Computing, pp. 249-258, 1998.

Studies in recent years have made it increasingly clear that LDPC coding, when its code length is prolonged, provides performance levels approaching the Shannon limit like turbo coding. Because its minimum distance is proportional to its code length, LDPC coding offers an excellent block error rate and develops few so-called error floor phenomena, which can be observed in decoding characteristic by turbo coding arrangements.

The above-mentioned advantages of LDPC coding have led to the adoption of this coding technique into DVB (Digital Video Broadcasting)-T.2 (DVB BlueBook A122 Rev. 1, Frame structure channel coding and modulation for a second generation digital terrestrial television broadcasting system (DVB-T2), searched for on Mar. 17, 2009 at the DVB site dated Sep. 1, 2008 <URL: http://www.dvb.org/technology/standards/>(Non-Patent Document 1)). That is, DVB-T.2 is the second generation digital terrestrial TV broadcasting standard being deliberated on (as of March 2009) by ETSI (European Telecommunication Standard Institute).

SUMMARY OF THE INVENTION

The need exists for DVB-T.2-compatible receivers to perform LDPC decoding of PLPs (physical layer pipes) and L1 (layer 1) using a single decoder. However, this need has yet to be met adequately by candidate receivers.

PLPs denote data streams and L1 represent Layer 1 (physical layer) transmission parameters under DVB-T.2. In addition to modulation and demodulation parameters, L1 includes the position and size of each PLP and the error-correcting system in use. In the case of multiple PLPs (called multi-PLPs hereunder), the positions and sizes of PLPs vary from one T2 frame to another. This means that unless L1 is taken, any desired PLP cannot be extracted following a frequency deinterleaving process. The T2 frame is the unit of data transmission on the physical layer under DVB-T.2. As such, the T2 frame is composed of P1 and P2 symbols as well as data symbols including a PLP. L1 is included in a P2 symbol of each T2 frame. Details of L1 are disclosed illustratively in the above-cited Non-Patent Document 1.

The present embodiment has been made in view of the above circumstances and provides a receiving apparatus, a receiving method, a program, and a receiving system for enabling a DVB-T.2-compatible receiver to perform LDPC decoding of PLPs and L1 by use of a single decoder.

In carrying out the present invention and according to one embodiment thereof, there is provided a receiving apparatus including: an LDPC decoding device configured such that when an LDPC-coded data signal, LDPC representing Low Density Parity Check, and an LDPC-coded transmission control signal are transmitted in multiplexed fashion, the LDPC decoding device can decode both the data signal and the transmission control signal; and a holding device configured to be located upstream of the LDPC decoding device and to hold at least the transmission control signal upon receipt of the data signal and the transmission control signal. The receiving apparatus further includes a control device configured to control the LDPC decoding device to decode the data signal while the transmission control signal is being accumulated in the holding device and to interrupt the current decoding so as to control the LDPC decoding device to decode the transmission control signal when the transmission control signal has been accumulated in the holding device.

Preferably, the transmission control signal and the data signal may have undergone a frequency interleaving process; and the holding device may hold the data signal and the transmission control signal upon receipt thereof and may perform a frequency deinterleaving process corresponding to the frequency interleaving process on the data signal and the transmission control signal.

Preferably, the receiving apparatus may comply with the Digital Video Broadcasting Standard T.2 known as DVB-T.2; and the transmission control signal may be an L1 included in a P2 symbol stipulated by the DVB-T.2.

According to other embodiments of the present invention, there are provided a receiving method and a program corresponding to the receiving apparatus embodying the invention as outlined above.

Where the receiving apparatus, receiving method, and program of the present embodiment are provided as outlined above, the receiving apparatus includes: an LDPC (Low Density Parity Check) decoding device configured such that when an LDPC-coded data signal and an LDPC-coded transmission control signal are transmitted in multiplexed fashion, the LDPC decoding device can decode both the data signal and the transmission control signal; and a holding device configured to be located upstream of the LDPC decoding device and to hold at least the transmission control signal upon receipt of the data signal and the transmission control signal. Control is then exercised by the receiving method or program to have the LDPC decoding device decode the data signal while the transmission control signal is being accumulated in the holding device. Control is further exercised by the receiving method or program to interrupt the current decoding to let the LDPC decoding device decode the transmission control signal when the transmission control signal has been accumulated in the holding device.

According to another embodiment of the present invention, there is provided a receiving system including: an acquisition device configured to acquire an LDPC-coded data signal, LDPC representing Low Density Parity Check, and an LDPC-coded transmission control signal when these signals are transmitted in multiplexed fashion over a predetermined channel; and a channel decoding device configured to perform a channel decoding process on the signals acquired by the acquisition device over the channel, the channel decoding process at least including a process for correcting errors that may have occurred over the channel, the channel decoding device further outputting the signals thus processed. The receiving system further includes either an information source decode processing device configured to perform an information source decoding process on the signals output from the channel decoding device, or a recording device configured to record the signals output from the channel decoding device to a recording medium. The channel decoding device includes: an LDPC decoding device configured to decode the data signal and the transmission control signal; a holding device configured to be located upstream of the LDPC decoding device and to hold at least the transmission control signal upon receipt of the data signal and the transmission control signal; and a control device configured to control the LDPC decoding device to decode the data signal while the transmission control signal is being accumulated in the holding device and to interrupt the current decoding so as to control the LDPC decoding device to decode the transmission control signal when the transmission control signal has been accumulated in the holding device.

Where the receiving system of the present embodiment is provided as outlined above, the system includes: an acquisition device configured to acquire an LDPC (Low Density Parity Check)-coded data signal and an LDPC-coded transmission control signal when these signals are transmitted in multiplexed fashion over a predetermined channel; and a channel decoding device configured to perform a channel decoding process on the signals acquired by the acquisition device over the channel, the channel decoding process at least including a process for correcting errors that may have occurred over the channel, the channel decoding device further outputting the signals thus processed. The system further includes either an information source decode processing device configured to perform an information source decoding process on the signals output from the channel decoding device, or a recording device configured to record the signals output from the channel decoding device to a recording medium. The channel decoding device includes an LDPC decoding device configured to decode the data signal and the transmission control signal, and a holding device configured to be located upstream of the LDPC decoding device and to hold at least the transmission control signal upon receipt of the data signal and the transmission control signal. The channel decoding device is arranged to exercise control to have the LDPC decoding device decode the data signal while the transmission control signal is being accumulated in the holding device. The channel decoding device is further arranged to exercise control to interrupt the current decoding to let the LDPC decoding device decode the transmission control signal when the transmission control signal has been accumulated in the holding device.

According to the present embodiment, as outlined above, the DVB-T.2-compatible receiver is arranged to perform LDPC decoding of PLPs and L1 using a single decoder.

BRIEF DESCRIPTION OF THE DRAWINGS

FIG. 8 is a block diagram showing a third structure example of the receiving system applicable to the receiving apparatus of FIG. 1; and FIG. 9 is a block diagram showing a typical hardware structure of the receiving apparatus embodying the present invention.

DETAILED DESCRIPTION OF THE PREFERRED EMBODIMENTS

[Structure of the receiving apparatus complying with DVB-T.2]

Figure 1:
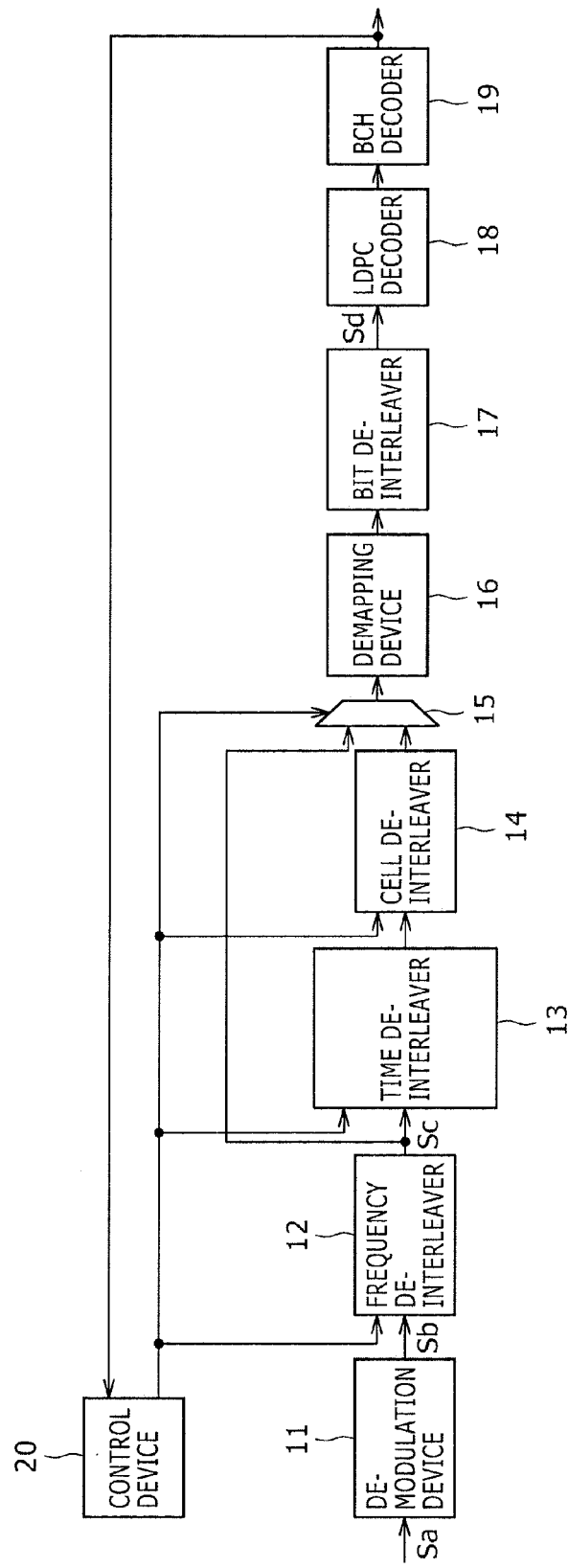
FIG. 1 is a schematic view showing a typical structure of a receiving apparatus practiced as one embodiment of the present invention.

FIG. 1 schematically shows a typical structure of a receiving apparatus practiced as one preferred embodiment of the present invention.

In digital broadcasting under DVB-T.2, LDPC codes are turned into symbols of orthogonal modulation (digital modulation) such as QPSK (Quadrature Phase Shift Keying), and these symbols are mapped at constellation points before being transmitted. Illustratively, the receiving apparatus of FIG. 1 adopts OFDM (Orthogonal Frequency Division Multiplexing) as the modulation system for digital broadcasting.

The receiving apparatus of FIG. 1 functions as a digital broadcast receiving apparatus that complies with DVB-T.2. The DVB-T.2-compatible receiving apparatus is structured to include a demodulation device 11, a frequency deinterleaver 12, a time deinterleaver 13, a cell deinterleaver 14, a switching device 15, a demapping device 16, a bit deinterleaver 17, an LDPC decoder 18, a BCH decoder 19, and a control device 20.

Broadcast waves from a broadcasting station, not shown, are received by the receiving apparatus of FIG. 1. Inside the receiving apparatus, the received broadcast waves are turned into an IF (Intermediate Frequency) signal Sa by a tuner or the like, not shown, the IF signal Sa being forwarded to the demodulation device 11. That is, the IF signal Sa becomes an input signal to the demodulation device 11. The demodulation device 11 orthogonally demodulates the input signal Sa into a baseband OFDM signal that is output as an output signal Sb and fed to the frequency deinterleaver 12.

The output signal Sb from the demodulation device becomes the input signal to the frequency deinterleaver 12. In turn, the frequency deinterleaver 12 performs a frequency deinterleaving process on the input signal Sb. That is, the frequency deinterleaver 12 is designed to deinterleave what is interleaved in closed fashion within OFDM symbols. The deinterleaving process is carried out in units of cells (in units of OFDM carriers in this example).

More specifically, the input signal Sb is a so-called OFDM frequency domain signal having undergone FFT (Fast Fourier Transform) computation. In the frequency deinterleaving process, a pseudo random pattern is used to switch carrier positions in the input signal Sb that is an OFDM frequency domain signal.

As mentioned above, a T2 frame according to DVB-T.2 includes P1 and P2 symbols and data symbols. Of these symbols, the P1 symbol is removed upon output from the demodulation device 11. Thus the OFDM frequency domain signal made up of P2 and data symbols is supplied to the frequency deinterleaver 12 as the input signal Sb. As a result, the frequency deinterleaver 12 outputs an output signal Sc in the form of frequency-deinterleaved P2 symbols (simply called P2 symbols hereunder where appropriate) and frequency-deinterleaved data symbols (simply called data symbols hereunder where appropriate).

With this embodiment, the output signal Sc of the frequency deinterleaver 12 is delayed by at least one P2 symbol relative to the input signal Sb in order to permit LDPC decoding of the LDPC codes of PLP and L1. In other words, the frequency deinterleaver 12 is considered to have the so-called buffer function from an LDPC decoding point of view. The buffer function will be discussed later in detail with reference to FIG. 4 and other drawings.

Of the elements of the output signal Sc from the frequency deinterleaver 12, the signal element corresponding to PLP is fed to the time deinterleaver 13. Of the other elements of the output signal Sc, the signal element corresponding to L1 (included in the P2 symbol) is forwarded to the switching device 15.

The signal output from the frequency deinterleaver 12 and input to the time deinterleaver 13 has undergone a block interleaving process (time interleaving process) performed across a plurality of LDPC codes on the transmitting side. This process is carried out in units of cells (in units of constellations in this example). Thus the time deinterleaver 13 performs a deinterleaving process corresponding to the time interleaving process on the input signal and feeds the cell deinterleaver 14 with the signal resulting from the deinterleaving process.

The signal output from the time deinterleaver 13 and input to the cell deinterleaver 14 has undergone an interleaving process (cell interleaving process) closed within LDPC codes on the transmitting side. This process is carried out in units of cells (in units of constellations in this example). Thus the cell deinterleaver 14 performs a deinterleaving process corresponding to the cell interleaving process on the input signal and feeds the switching device 15 with the signal resulting from the deinterleaving process.

In the manner described above, a transmission control signal corresponding to L1 output from the frequency deinterleaver 12 (the control signal is simply called L1 hereunder where appropriate) and a data signal corresponding to the PLP output from the cell deinterleaver 14 (the data signal is simply called the data hereunder where appropriate) are supplied to the input of the switching device 15. Under control of the control device 20, the switching device 15 selects either L1 or the data as its output data.

More specifically, with this embodiment in a normal state under control of the control device 20, the switching device 15 outputs the data input from the cell deinterleaver 14. When L1 is output from the frequency deinterleaver 12, the switching device 15 under control of the control device 20 outputs L1 through interrupt handling. That is, when L1 is output from the frequency deinterleaver 12, the control device 20 interrupts the operations of the time deinterleaver 13 and cell deinterleaver 14 and allows L1 to reach the LDPC decoder 18 via the demapping device 16 and bit deinterleaver 17 so that the LDPC decoder 18 puts L1 to LDPC decoding.

The demapping device 16 converts the output data from the switching device 15 into LDPC-coded data in units of sign bits and feeds the converted data to the bit deinterleaver 17.

The data output from the demapping device 16 and input to the bit deinterleaver 17 has undergone a bit interleaving process in units of LDPC sign bits on the transmitting side. Thus the bit deinterleaver 17 performs a bit deinterleaving process on the input data to obtain an LDPC code with its sign bit reverted to the position in effect before the bit interleaving process. The signal made up of such LDPC codes is fed to the LDPC decoder 18 as an output signal Sd from the bit deinterleaver 17.

That is, the output signal Sd from the bit deinterleaver 17 becomes the input signal to the LDPC decoder 18. The LDPC decoder 18 then performs an LDPC decoding process on the input signal Sd using a conversion check matrix generated from the check matrix utilized in the LDPC coding process on the transmitting side. The data resulting from the LDPC decoding process is fed to the BCH decoder 19.

The data output from the LDPC decoder 18 and input to the BCH decoder 19 has undergone a BCH (Bose-Chaudhuri-Hocquenghem) coding process as the error-correcting process on the transmitting side. The BCH decoder 19 thus decodes the BCH-coded data and outputs the data acquired from the decoding process to the outside.

The control device 20 controls the operations of the components ranging from the frequency deinterleaver 12 to the switching device 15 typically based on the output data from the BCH decoder 19. Illustratively, the control device 20 controls a series of operations up to LDPC decoding in accordance with the operation schedule explained below.

[Operation Schedule of the Receiving Apparatus Complying with DVB-T.2]

Figure 2:
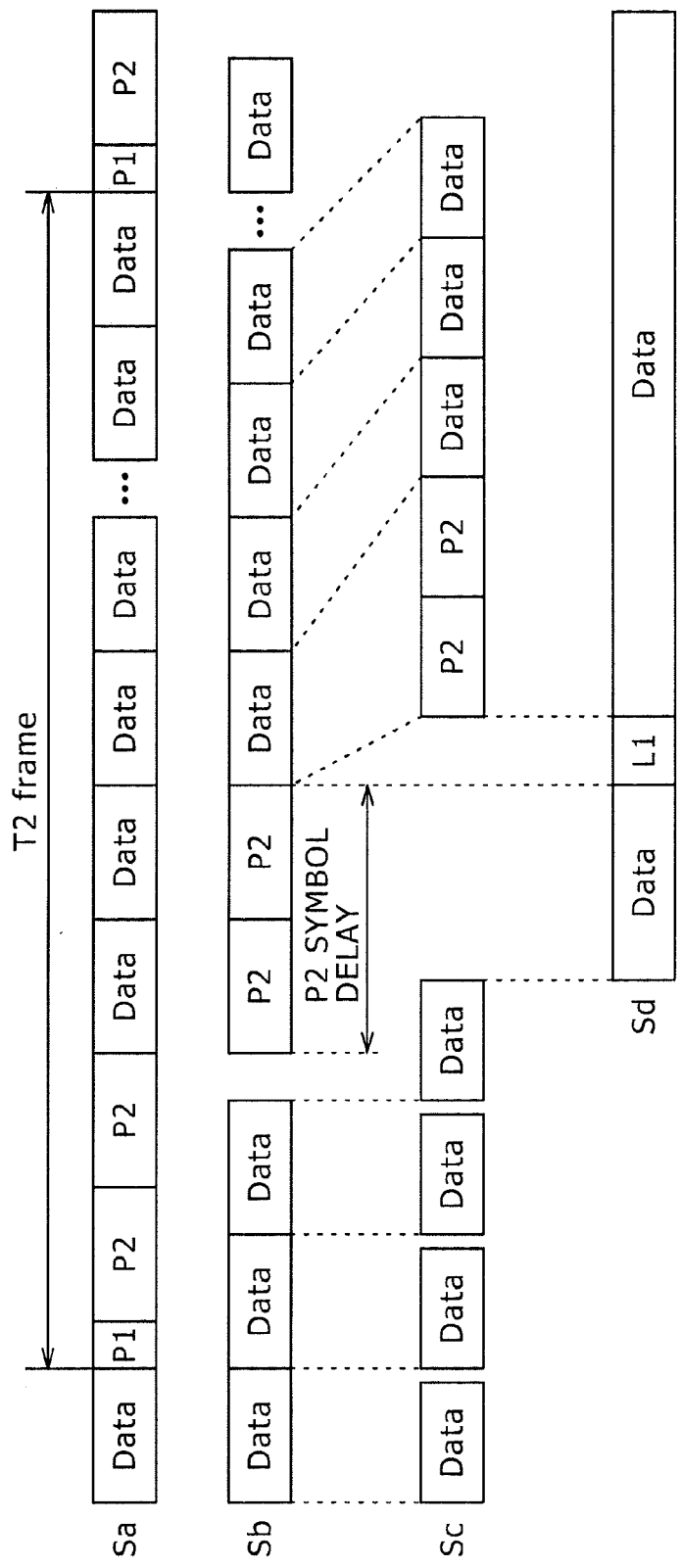
FIG. 2 is a schematic view explanatory of a typical operation schedule of the receiving apparatus whose structure is shown in FIG. 1.

FIG. 2 is a schematic view explanatory of a typical operation schedule of the receiving apparatus whose structure is illustrated in FIG. 1.

Shown in FIG. 2 are timing charts in units of symbols regarding, from the top down, the input signal Sa to the demodulation device 11, the output signal Sb from the demodulation device 11, the output signal Sc from the frequency deinterleaver 12, and the output signal Sd (subject to LDPC decoding) to the LDPC decoder 18.

For purpose of simplification and illustration, the output signal Sd in FIG. 2 is assumed to be a signal in effect when there is no delay in the cell deinterleaver 14, demapping device 16, and bit deinterleaver 17.

T2 frames (indicated as "T2 frame" in FIG. 2) each made up of one P1 symbol ("P1" in FIG. 2), two P2 symbols ("P2" in FIG. 2), and a plurality of data symbols ("Data" in FIG. 2) are input successively as the input signal Sa to the demodulation device 11.

The input signal Sa is then deprived of the P1 symbol and delayed by the amount corresponding to two P2 symbols to become the signal Sb that is output from the demodulation device 11 and input to the frequency deinterleaver 12.

The frequency deinterleaver 12 delays the input signal Sb by the amount corresponding to two P2 symbol to obtain the signal Sc, and outputs the resulting signal Sc as the output signal.

The speed at which the output signal Sc from the frequency deinterleaver 12 is transmitted to the time deinterleaver 13 is higher than the speed at which the input signal Sb is input to the frequency deinterleaver 12. For this reason, the amount of delay of the output signal Sc from the frequency deinterleaver 12 relative to the input signal Sb to the frequency deinterleaver 12 is equivalent to one symbol at the last timing of the T2 frame.

Of the elements of the output signal Sc from the frequency deinterleaver 12, the PLP data is supplied to the time deinterleaver 13 and L1 (included in each P2 symbol) is fed to the switching device 15. As a result, the target to be decoded by the LDPC deinterleaver 18 is the signal Sd shown in FIG. 2. That is, when data symbols have been accumulated in the time deinterleaver 13, the LDPC code of the corresponding PLP (indicated as "Data" in the signal Sd in FIG. 2) starts to be LDPC-decoded. When L1 is output from the frequency deinterleaver 12, an interruption is made and the LDPC decoding of L1 is performed. That is, the LDPC decoder 18 performs the LDPC decoding of L1 halfway through the LDPC decoding of data.

[LDPC Decoding Operation in Multi-PLP Mode]

What follows is a description of the LDPC decoding operation in multi-PLP mode.

Figure 3:
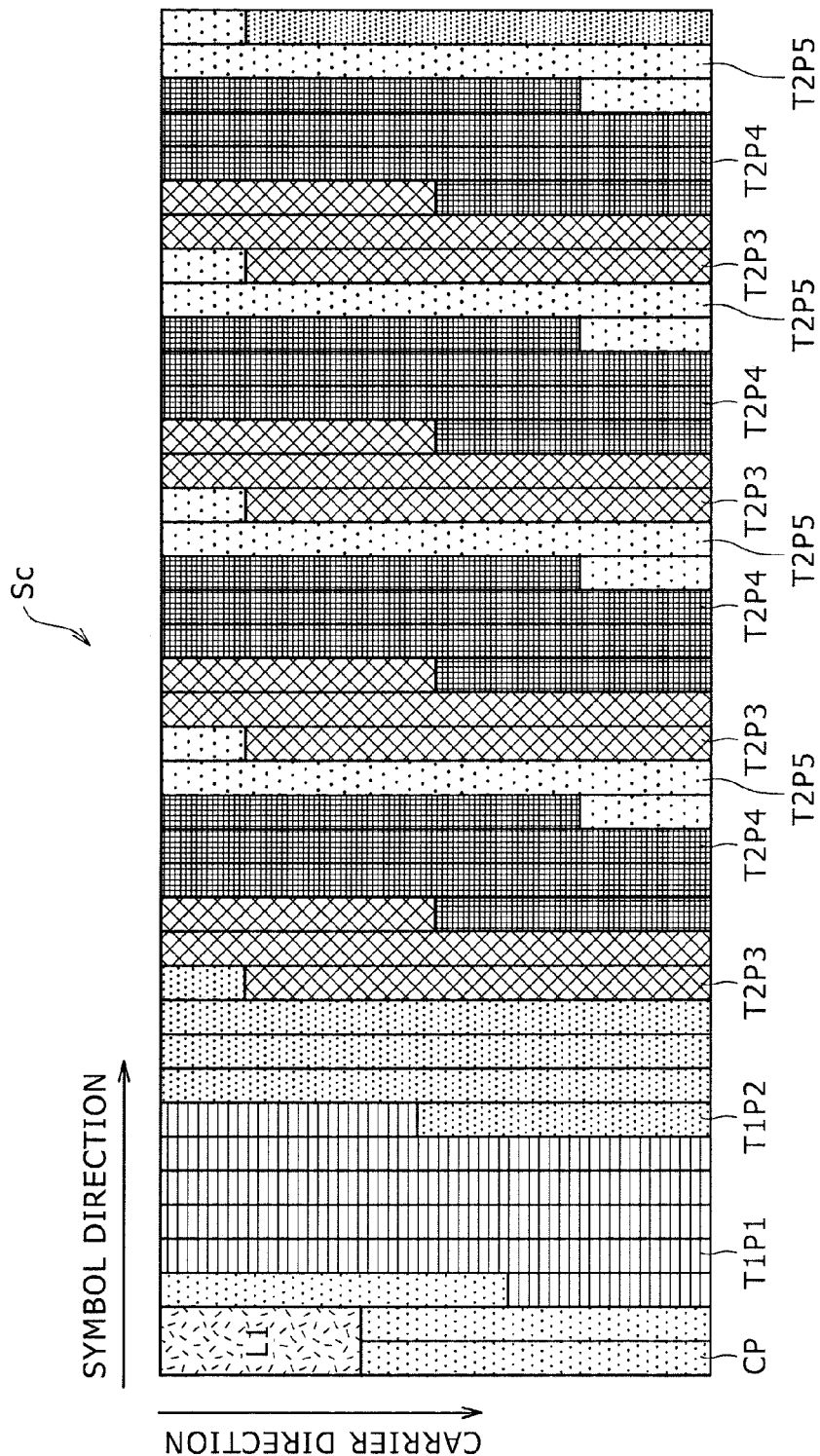
FIG. 3 is a schematic view showing a typical structure of an output signal from a frequency deinterleaver in multi-PLP mode.

FIG. 3 schematically shows a typical structure of the output signal Sc from the frequency deinterleaver 12 in multi-PLP mode.

In FIG. 3, each column represents one symbol.

The output signal Sc in FIG. 3 is composed of an L1 and a plurality of PLPs.

In the example of FIG. 3, there are a common PLP (called CP hereunder), Type 1 PLP(1)(called T1P1 hereunder), and Type 1 PLP(2)(called T1P2 hereunder) as PLPs.

In the same example, there also exist Type 2 PLP(3)(called T2P3 hereunder), Type 2 PLP(4)(called T2P4 hereunder), and Type 2 PLP(5)(called T2P5 hereunder) as more PLPs. In FIG. 3, T2P3, T2P4, and T2P5 are each shown split into four portions.

In multi-PLP mode, desired PLPs (up to two PLPs) are extracted from these multiple PLPs and LDPC-decoded. It should be noted that CP is always LDPC-decoded. Thus besides CP, a desired one of T1P1, T1P2, T2P3, T2P4, and T2P5 is subject to LDPC decoding.

Figure 4:
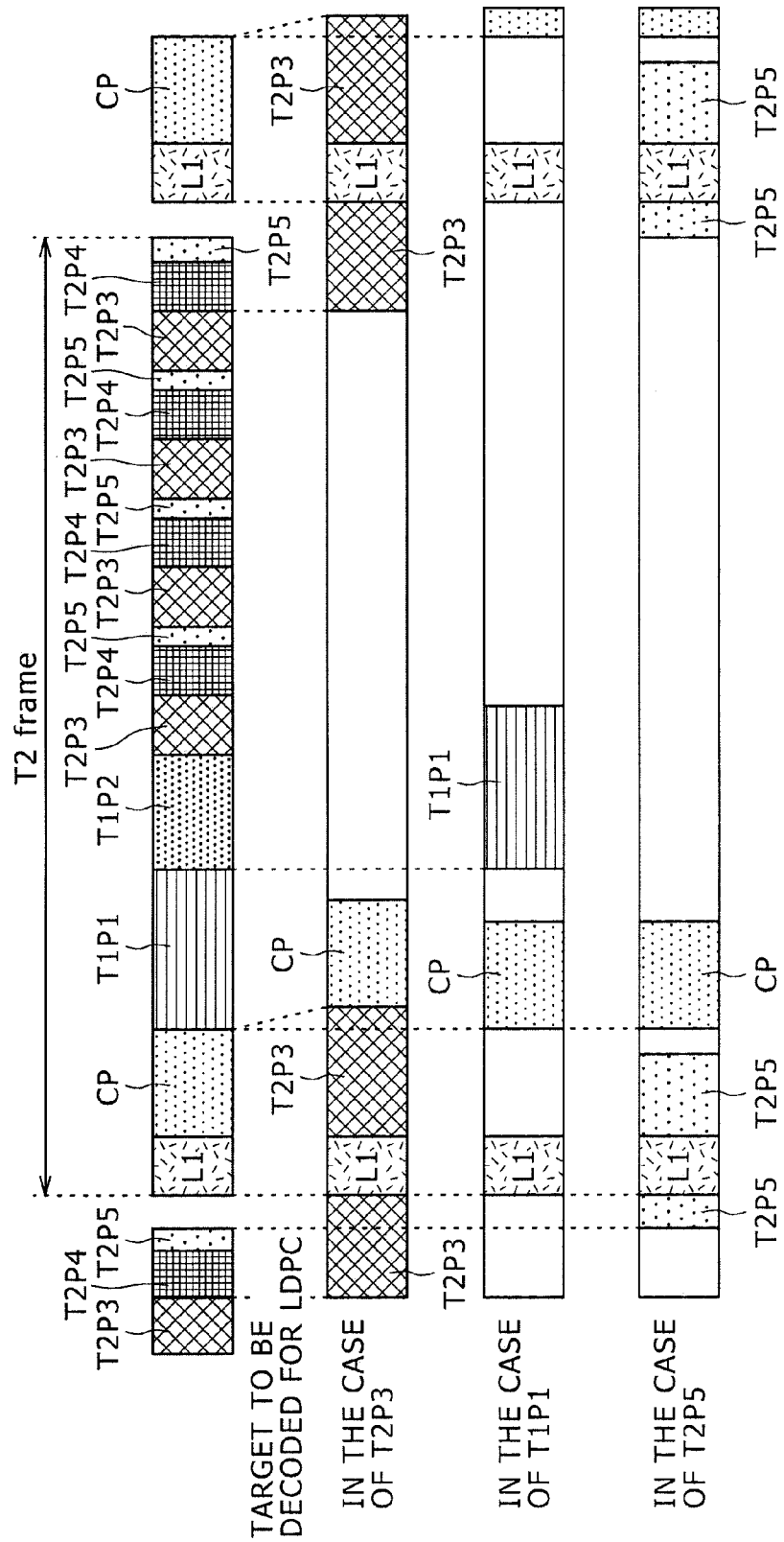
FIG. 4 is a schematic view showing a typical operation schedule of LDPC decoding in multi-PLP mode, the view illustrating how decoding is scheduled in units of PLPs.

FIG. 4 schematically shows a typical operation schedule of LDPC decoding in multi-PLP mode, the view illustrating how decoding is typically scheduled in units of PLPs.

Shown at the top of FIG. 4 is a timing chart of what is read from the frequency deinterleaver 12 in units of PLPs.

Shown second from the top in FIG. 4 is a timing chart in effect when CP and T2P3 are subject to LDPC decoding. In this case, during the LDPC decoding of T2P3 in the preceding T2 frame, an interruption is made and L1 of the current T2 frame (shown at the top of FIG. 4) is LDPC-decoded. When the LDPC decoding of L1 is terminated, the LDPC decoding of T2P3 is resumed. At the end of the LDPC decoding of T2P3, the LDPC decoding of CP in the current T2 frame is resumed.

Shown third from the top in FIG. 4 is a timing chart in effect when CP and T1P1 are subject to LDPC decoding. In this case, L1, CP, and T1P1 in the current T2 frame are LDPC-decoded successively. That is, no interruption takes place for the LDPC decoding of L1 during the LDPC decoding of a PLP.

Shown fourth from the top in FIG. 4, i.e., at the bottom of FIG. 4, is a timing chart in effect when CP and T2P5 are subject to LDPC decoding. In this case, during the LDPC decoding of T2P5 in the preceding T2 frame, an interruption is made and L1 of the current T2 frame (shown at the top of FIG. 4) is LDPC-decoded. When the LDPC decoding of L1 is terminated, the LDPC decoding of T2P5 is resumed. At the end of the LDPC decoding of T2P5, the LDPC decoding of CP in the current T2 frame is resumed.

[How to Use the Frequency Deinterleaver]

Described below is how the frequency deinterleaver 12 is typically used.

As discussed above, L1 is included in each P2 symbol. Thus before the LDPC decoding of L1 takes place, the frequency deinterleaver 12 needs to accumulate all P2 symbols.

During the LDPC decoding of L1, the frequency deinterleaver 12 further needs to accumulate the data symbols being input from the demodulation device 11.

The frequency deinterleaver 12 needs to have a size large enough to accommodate a 32k-point FFT. Where a 16k-, an 8k-, a 4k-, a 2k- or a 1k-point FFT is adopted, the frequency deinterleaver 12 can accommodate data equivalent to 2, 4, 8, 16, or 32 symbols in size.

Under DVB-T.2, the number of P2 symbols is one in the case of 32k or 16k points. The number of P2 symbols is doubled in the case of 8k points; the number of P2 symbols is quadrupled in the case of 4k points; and so on.

That is, the frequency deinterleaver 12 accommodates as many data symbols as the number of P2 symbols in the case of 16k points or less.

In the case of 32k points, interleave patterns arranged in front-back relation to one another are used alternately. That means the LDPC decoding of L1 needs to be finished and the reading of data needs to be started before the next symbol starts to be written.

In the case of 16k points or less, a single interleave pattern is used. That means the reading of a given domain needs to be completed before the writing of that domain is started.

As is understood from what was discussed above, the buffer function of the frequency deinterleaver 12 works as shown in FIGS. 5A through 5D.

FIGS. 5A through 5D are views explanatory of the buffer function of the frequency deinterleaver 12.

Figure 5:
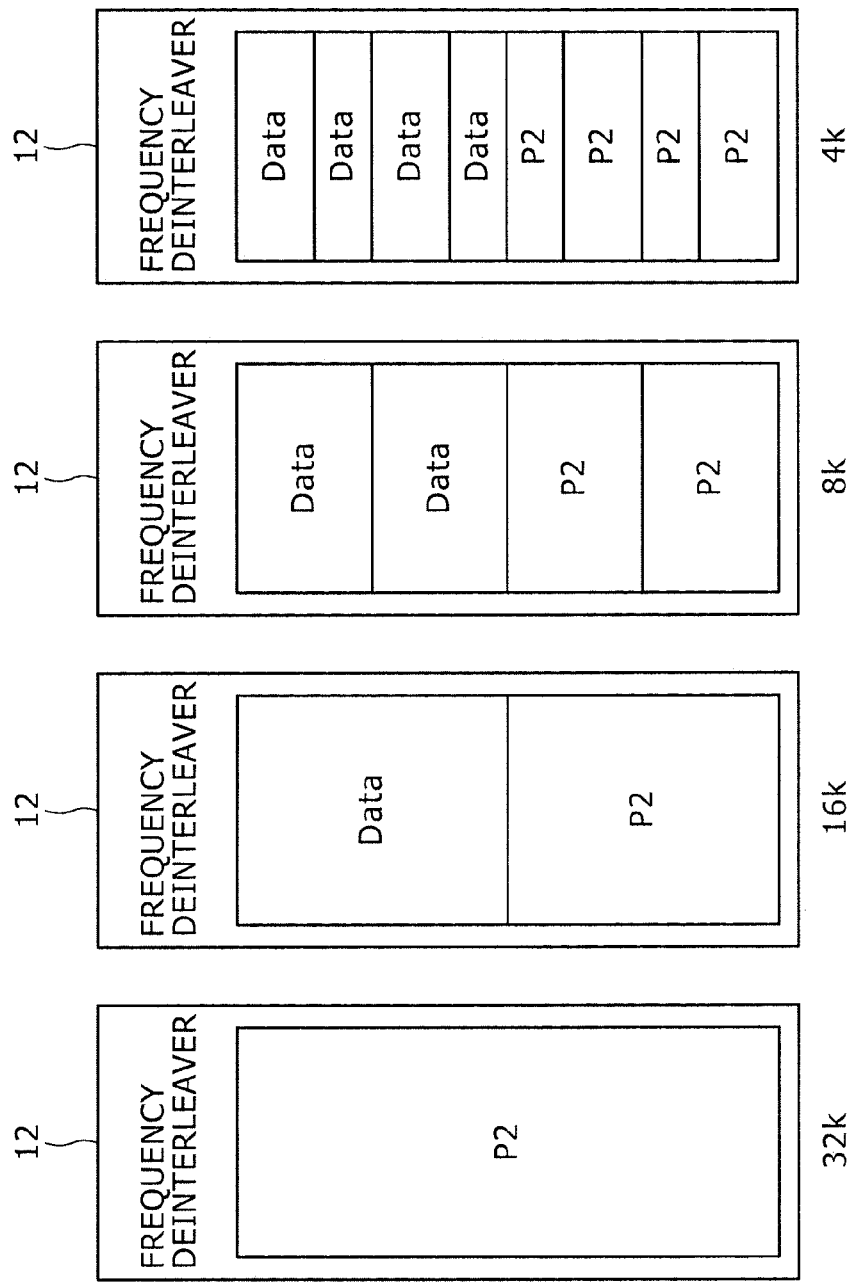
FIGS. 5A, 5B, 5C and 5D are views explanatory of how the frequency deinterleaver of the receiving apparatus in FIG. 1 is typically used.

In the case of 32k points, the frequency deinterleaver 12 can accommodate data equivalent to one symbol as shown in FIG. 5A. In this case, one P2 symbol can be held in the frequency deinterleaver 12.

In the case of 16k points, the frequency deinterleaver 12 can accommodate data equivalent to two symbols as shown in FIG. 5B. In this case, one P2 symbol and one data symbol can be held in the frequency deinterleaver 12.

In the case of 8k points, the frequency deinterleaver 12 can accommodate data equivalent to four symbols as shown in FIG. 5C. In this case, two P2 symbols and two data symbols can be held in the frequency deinterleaver 12.

In the case of 4k points, the frequency deinterleaver 12 can accommodate data equivalent to eight symbols as shown in FIG. 5D. In this case, four P2 symbols and four data symbols can be held in the frequency deinterleaver 12.

In the case of 2k or 1k points, not shown, the frequency deinterleaver 12 can accommodate as many data symbols as the number of P2 symbols.

[Recapping the Foregoing Description of the Receiving Apparatus Embodying the Present Invention]

To recapitulate what was described above, the receiving apparatus of FIG. 1 is a DVB-T.2-compatible demodulation device that time-shares a single LDPC decoding device for the LDPC decoding of L1 and PLPs.

From an LDPC decoding point of view, the frequency deinterleaver 12 possesses the buffer capability. That is, in cases other than 32k points, the frequency deinterleaver 12 is used as a buffer corresponding to a plurality of symbols. In such cases, the frequency deinterleaver 12 accommodates not only P2 symbols but also as many data symbols as possible. This can save time up to completion of the LDPC decoding of L1.

The time deinterleaver 13 needs to read data from the frequency deinterleaver 12 as soon as the writing of data to the latter is terminated. Meanwhile, the LDPC decoding of L1 needs to be started as soon as possible so that the decoding be completed before the P2 symbols written to the frequency deinterleaver 12 are overwritten with subsequent symbols. For this reason, the control device 20 exercises interrupt control to halt the LDPC decoding of a PLP.

More specifically, the control device 20 stops the operations of the time deinterleaver 13 and cell deinterleaver 14 for interrupt control. Halting the LDPC decoding of the PLP halfway under interrupt control destroys the data being processed. This demands the control device 20 to again exercise read-out control via the time deinterleaver 13 and cell deinterleaver 14 upon completion of the LDPC decoding of L1.

In multi-PLP mode, LDPC decoding is carried out in keeping with the scheduling shown in FIG. 2 or FIG. 4. That is, the demapping device 16, bit deinterleaver 17, LDPC decoder 18, and BCH decoder 19 are time-shared so as to effect the LDPC decoding of L1, the common PLP (CP in FIGS. 3 and 4), and data PLPs (T1P1, T1P2, T2P3, T2P4, T2P5). As a result, one LDPC decoding device can replace a maximum of three LDPC decoding devices that have been traditionally demanded.

[Structure of the Receiving System]

Figure 6:
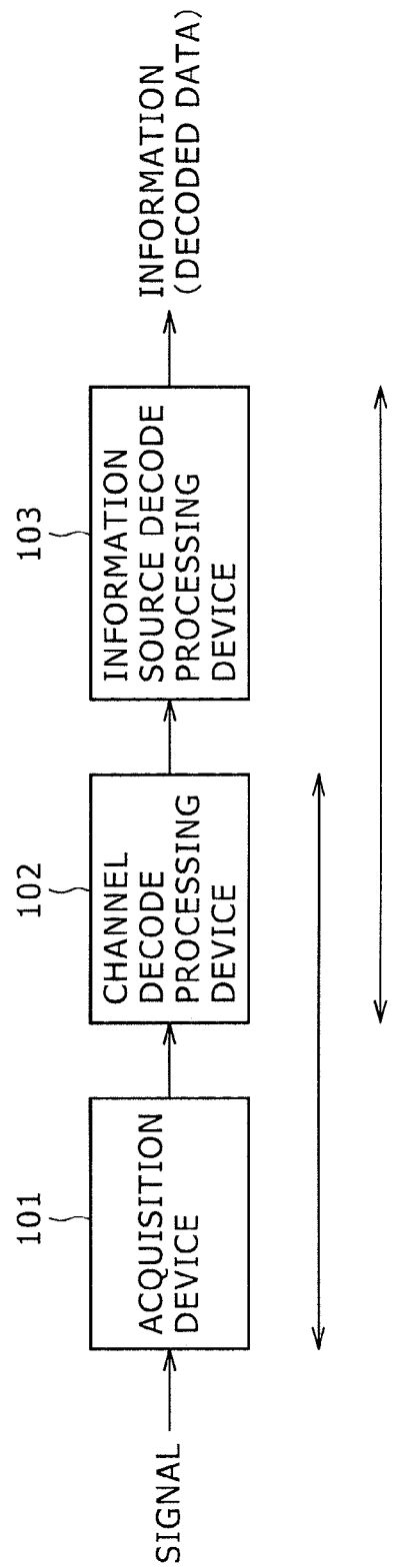
FIG. 6 is a block diagram showing a first structure example of a receiving system applicable to the receiving apparatus of FIG. 1.

FIG. 6 is a block diagram showing a first structure example of the receiving system applicable to the receiving apparatus of FIG. 1.

In FIG. 6, the receiving system is made up of an acquisition device 101, a channel decode processing device 102, and an information source decode processing device 103.

The acquisition device 101 acquires a signal including at least LDPC codes obtained by LDPC-coding target data such as the video and audio data of broadcast programs. Illustratively, the acquisition device 101 acquires the signal from such channels as terrestrial digital broadcasts, satellite digital broadcasts, CATV (Cable Television) networks, and other networks including the Internet, not shown, and supplies the acquired signal to the channel decode processing device 102.

Where the signal acquired by the acquisition device 101 has been broadcast illustratively by broadcasting stations using terrestrial waves, satellite waves or CATV networks, the acquisition device 101 is typically composed of a set-top box (STB) or the like. Where the signal acquired by the acquisition device 101 has been multicast by web servers in the form of IPTV (Internet Protocol Television), the acquisition device 101 is constituted illustratively by a network interface (I/F) such as a network interface card (NIC).

The channel decode processing device 102 performs channel decode processing including at least a process of correcting errors that may have occurred over the channels on the signal acquired by the acquisition device 101 from the channels. The channel decode processing device 102 forwards the signal thus processed to the information source decode processing device 103.

The signal acquired from the channels by the acquisition device 101 has undergone at least error-correcting coding aimed at correcting any errors that may have developed on the channels. Thus the channel decode processing device 102 carries out channel decode processing such as error correcting decoding on the acquired signal.

Typical error correcting coding techniques include LDPC coding and Reed-Solomon coding. With this embodiment, at least LDPC coding is assumed to be performed.

The channel decode processing may include demodulation of modulated signals.

On the signal having undergone the channel decode processing, the information source decode processing device 103 performs information source decode processing including at least a process of decompressing compressed information.

The signal acquired by the acquisition device 101 from the channels may have undergone compression coding for reducing the amount of the video and audio data involved. In that case, the information source decode processing device 103 performs information source decode processing such as decompression of compressed information on the signal having undergone channel decode processing.

If the signal acquired by the acquisition device 101 from the channels has not undergone compression coding, then the information source decode processing device 103 does not decompress compressed information.

Typical decompression techniques include MPEG (Moving Picture Experts Group) decoding. The channel decode processing may also include descrambling in addition to data decompression.

In the receiving system structured as described above, the acquisition device 101 acquires the signal typically made of video and audio data having undergone compression coding such as MPEG coding as well as error correcting coding such as LDPC coding. The signal thus acquired is sent to the channel decode processing device 102.

The channel decode processing device 102 performs as channel decode processing the same processes as those carried out by the components ranging from the demodulation device 11 to the BCH decoder 19 on the signal coming from the acquisition device 101. The signal resulting from the channel decode processing is supplied to the information source decode processing device 103.

The information source decode processing device 103 carries out information source decode processing such as MPEG decoding on the signal coming from the channel decode processing device 102. The pictures and/or sounds resulting from the information source decode processing are then output.

The above-described receiving system of FIG. 6 can be applied illustratively to TV tuners or the like for receiving digital TV broadcasts.

The acquisition device 101, channel decode processing device 102, and information source decode processing device 103 may each be structured as an independent device (hardware such as IC (integrated circuits)) or software module.

A set of at least two devices out of the acquisition device 101, channel decode processing device 102, and information source decode processing device 103 may be established as an independent device. One such set may illustratively be composed of the acquisition device 101 and channel decode processing device 102. Another set may be formed by the channel decode processing device 102 and information source decode processing device 103. Yet another set may be constituted by the acquisition device 101, channel decode processing device 102, and information source decode processing device 103.

Figure 7:
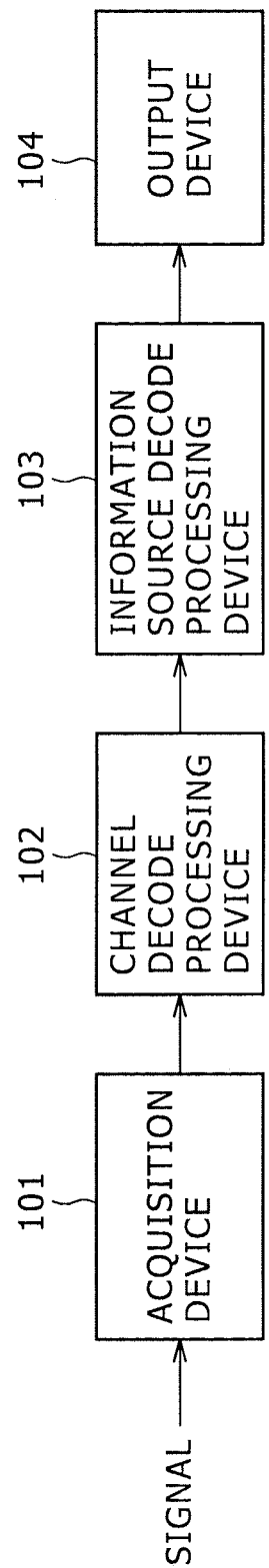
FIG. 7 is a block diagram showing a second structure example of the receiving system applicable to the receiving apparatus of FIG. 1.

FIG. 7 is a block diagram showing a second structure example of the receiving system applicable to the receiving apparatus of FIG. 1.

In FIG. 7, the components whose equivalents are found in FIG. 6 are designated by like reference numerals, and their descriptions will be omitted where appropriate.

The receiving system of FIG. 7 is common to that of FIG. 6 in that the system includes the acquisition device 101, the channel decode processing device 102 and information source decode processing device 103. What makes the receiving system of FIG. 7 different from that of FIG. 6 is that the system includes a newly added output device 104.

The output device 104 may be constituted by a display device for displaying pictures and/or by speakers for outputting sounds. As such, the output device 104 serves to output pictures and sounds derived from the signal output from the information source decode processing device 103. That is, the output device 104 displays pictures and/or outputs sounds.

The above-described receiving system of FIG. 7 may be applied illustratively to TV sets for receiving digital TV broadcasts or to radio receivers or the like for receiving radio broadcasts.

It should be noted that if the signal acquired by the acquisition device 101 has not undergone compression coding, then the signal output from the channel decode processing device 102 is sent directly to the output device 104.

FIG. 8 is a block diagram showing a third structure example of the receiving system applicable to the receiving apparatus of FIG. 1.

In FIG. 8, the components whose equivalents are found in FIG. 6 are designated by like reference numerals, and their descriptions will be omitted where appropriate.

The receiving system of FIG. 8 is common to that of FIG. 6 in that the system includes the acquisition device 101 and channel decode processing device 102.

What makes the receiving system of FIG. 8 different from that of FIG. 6 is that the system is not furnished with the information source decode processing device 103 and includes a newly added recording device 105.

The recording device 105 records (i.e., stores) the signal output from the channel decode processing device 102 (such as TS packets in the MPEG format) onto recording (storage) media such as optical disks, hard disks (magnetic disks), or flash memories.

The above-described receiving system of FIG. 8 can be applied illustratively to recorders or the like for recording TV broadcasts.

In FIG. 8, the receiving system may be structured to include the information source decode processing device 103 so that the signal having undergone information source decode processing, i.e., decoded pictures and sounds, may be recorded by the recording device 105.

[Applying the Present Embodiment to Programs]

The series of the processes described above may be executed either by hardware or by software.

In such cases, at least part of the receiving system including the above-described receiving apparatus may be constituted illustratively in the form of a computer shown in FIG. 9.

In FIG. 9, a CPU (central processing unit) 201 performs various processes according to the programs held in a ROM (read only memory) 202 or in keeping with the programs loaded into a RAM (random access memory) 203 from a storage device 208. The RAM 203 may also hold data needed by the CPU 201 in carrying out the diverse processing.

The CPU 201, ROM 202, and RAM 203 are interconnected via a bus 204. An input/output interface 205 is also connected to the bus 204.

The input/output interface 205 is connected with an input device 206 typically composed of a keyboard and a mouse and an output device 207 constituted illustratively by a display unit. The input/output interface 205 is further connected with a communication device 209 typically formed by a modem or a terminal adapter. The communication device 209 controls communications with other devices (not shown) via networks including the Internet.

A drive 210 is also connected as needed to the input/output interface 205. A piece of removable media 211 such as magnetic disks, optical disks, magneto-optical disks or semiconductor memories may be loaded into the drive 210. Computer programs retrieved from the loaded removable medium are installed as needed into the storage device 208.

Where the above-described processes are to be carried out by software, the programs constituting the software may be either incorporated beforehand in the dedicated hardware of the computer to be used or installed from a network or a recording medium into a general-purpose personal computer or like equipment capable of executing diverse functions based on the installed programs.

As shown in FIG. 9, the storage medium holding the programs thereon is offered to users not only as the removable media (package media) 211 apart from their computers and constituted by magnetic disks (including floppy disks) accommodating the program, optical disks (including CD-ROM (compact disk-read only memory) and DVD (digital versatile disc)), magneto-optical disks (including MD (Minidisc)), or semiconductor memories; but also in the form of the ROM 202 or the hard disk contained in the storage device 208, each accommodating the programs and incorporated beforehand in the computers.

In this specification, the steps describing the programs stored on the recording media represent not only the processes that are to be carried out in the depicted sequence (i.e., on a time series basis) but also processes that may be performed parallelly or individually and not chronologically.

In this specification, the term "system" refers to an entire configuration made up of a plurality of component devices and processing elements.

It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2009-072161 filed in the Japan Patent Office on Mar. 24, 2009, the entire content of which is hereby incorporated by reference.

What is claimed is:

1. A receiving apparatus comprising:
   an LDPC decoding device configured such that when an LDPC-coded data signal, LDPC representing Low Density Parity Check, and an LDPC-coded transmission control signal are transmitted in multiplexed fashion, said LDPC decoding device can decode both the data signal and the transmission control signal;
   a holding device configured to be located upstream of said LDPC decoding device and to hold at least said transmission control signal upon receipt of said data signal and said transmission control signal; and
   a control device configured to control said LDPC decoding device to decode said data signal while said transmission control signal is being accumulated in said holding device and to interrupt the current decoding so as to control said LDPC decoding device to decode said transmission control signal when said transmission control signal has been accumulated in said holding device, wherein when a physical layer pipe and a common physical layer pipe within a frame of said data signal are subject to LDPC decoding, an interruption is made and said transmission control signal of said frame is LDPC-decoded, and when the LDPC decoding of said transmission control signal of said frame is terminated, the LDPC decoding of said physical layer pipe is resumed, and at the end of the LDPC decoding of said physical layer pipe, the LDPC decoding of said common physical layer pipe in said frame is resumed.

2. The receiving apparatus according to claim 1, wherein said transmission control signal and said data signal have undergone a frequency interleaving process; and said holding device holds said data signal and said transmission control signal upon receipt thereof and performs a frequency deinterleaving process corresponding to said frequency interleaving process on said data signal and said transmission control signal.

3. The receiving apparatus according to claim 2, wherein said receiving apparatus complies with the Digital Video Broadcasting Standard T.2 known as DVB-T.2; and said transmission control signal is an L1 included in a P2 symbol stipulated by said DVB-T.2.

4. A receiving method for use with a receiving apparatus including an LDPC decoding device configured such that when an LDPC-coded data signal, LDPC representing Low Density Parity Check, and an LDPC-coded transmission control signal are transmitted in multiplexed fashion, said LDPC decoding device can decode both the data signal and the transmission control signal, and a holding device configured to be located upstream of said LDPC decoding device and to hold at least said transmission control signal upon receipt of said data signal and said transmission control signal, said receiving method comprising the steps of:

controlling said LDPC decoding device to decode said data signal while said transmission control signal is being accumulated in said holding device; and interrupting the current decoding so as to control said LDPC decoding device to decode said transmission control signal when said transmission control signal has been accumulated in said holding device, wherein when a physical layer pipe and a common physical layer pipe within a frame of said data signal are subject to LDPC decoding, an interruption is made and said transmission control signal of said frame is LDPC-decoded, and when the LDPC decoding of said transmission control signal of said frame is terminated, the LDPC decoding of said physical layer pipe is resumed, and at the end of the LDPC decoding of said physical layer pipe, the LDPC decoding of said common physical layer pipe in said frame is resumed.

5. A non-transitory computer readable medium for storing a program for a computer controlling a receiving apparatus including an LDPC decoding device configured such that when an LDPC-coded data signal, LDPC representing Low Density Parity Check, and an LDPC-coded transmission control signal are transmitted in multiplexed fashion, said LDPC decoding device can decode both the data signal and the transmission control signal, and a holding device configured to be located upstream of said LDPC decoding device and to hold at least said transmission control signal upon receipt of said data signal and said transmission control signal, said program causing said computer to execute a control process comprising the steps of:

controlling said LDPC decoding device to decode said data signal while said transmission control signal is being accumulated in said holding device; and interrupting the current decoding so as to control said LDPC decoding device to decode said transmission control signal when said transmission control signal has been accumulated in said holding device, wherein when physical layer pipe and a common physical layer pipe within a frame of said data signal are subject to LDPC decoding, an interruption is made and said transmission control signal of said frame is LDPC-decoded, and when the LDPC decoding of said transmission control signal of terminated, the LDPC decoding of said physical layer pipe is resumed, and at the end of the LDPC decoding of said physical layer pipe, the LDPC decoding of said common physical layer pipe in said frame is resumed.

6. A receiving system comprising:

an acquisition device configured to acquire an LDPC-coded data signal LDPC representing Low Density Parity Check, and an LDPC-coded transmission control signal when these signals are transmitted in multiplexed fashion over a predetermined channel;

a channel decoding device configured to perform a channel decoding process on the signals acquired by said acquisition device over said channel, said channel decoding process at least including a process for correcting errors that may have occurred over said channel, said channel decoding device further outputting the signals thus processed; and either an information source decode processing device configured to perform an information source decoding process on the signals output from said channel decoding device, or a recording device configured to record the signals output from said channel decoding device to a recording medium;

wherein said channel decoding device includes an LDPC decoding device configured to decode the data signal and the transmission control signal, a holding device configured to be located upstream of said LDPC decoding device and to hold at least said transmission control signal upon receipt of said data signal and said transmission control signal, and a control device configured to control said LDPC decoding device to decode said data signal while said transmission control signal is being accumulated in said holding device and to interrupt the current decoding so as to control said LDPC decoding device to decode said transmission control signal when said transmission control signal has been accumulated in said holding device, wherein when a physical layer pipe and a common physical layer pipe within a frame of said data signal are subject to LDPC decoding, an interruption is made and said transmission control signal of said frame is LDPC-decoded, and when the LDPC decoding of said transmission control signal of said frame is terminated, the LDPC decoding of said physical layer pipe is resumed, and at the end of the LDPC decoding of said physical layer pipe, the LDPC decoding of said common physical layer pipe in said frame is resumed.

7. A receiving apparatus comprising:

LDPC decoding means for, when an LDPC-coded data signal, LDPC representing Low Density Parity Check, and an LDPC-coded transmission control signal are transmitted in multiplexed fashion, being able to decode both the data signal and the transmission control signal;

holding means for being located upstream of said LDPC decoding means and for holding at least said transmission control signal upon receipt of said data signal and said transmission control signal; and control means for controlling said LDPC decoding means to decode said data signal while said transmission control signal is being accumulated in said holding means and interrupting the current decoding so as to control said LDPC decoding means to decode said transmission control signal when said transmission control signal has been accumulated in said holding means, wherein when a physical layer pipe and a common physical layer pipe within a frame of said data signal are subject to LDPC decoding, an interruption is made and said transmission control signal of said frame is LDPC-decoded, and when the LDPC decoding of said transmission control signal of said frame is terminated, the LDPC decoding of said physical layer pipe is resumed, and at the end of the LDPC decoding of said physical layer pipe, the LDPC decoding of said common physical layer pipe in said frame is resumed.

* * * * *